United States Patent
Cox et al.

(10) Patent No.: US 6,582,175 B2
(45) Date of Patent: Jun. 24, 2003

(54) ROBOT FOR HANDLING SEMICONDUCTOR WAFERS

(75) Inventors: Damon Cox, Bastrop, TX (US); Martin R. Elliott, Round Rock, TX (US); Chris Pencis, Austin, TX (US); Jeffrey C. Hudgens, San Francisco, CA (US); Michael Robert Rice, Pleasanton, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/135,261
(22) Filed: Apr. 29, 2002
(65) Prior Publication Data
US 2003/0035709 A1 Feb. 20, 2003

Related U.S. Application Data

(63) Continuation-in-part of application No. 09/549,777, filed on Apr. 14, 2000, now Pat. No. 6,379,095.

(51) Int. Cl.[7] .................................................. B65G 1/00
(52) U.S. Cl. ........................................................ 414/229
(58) Field of Search ................................ 414/279, 939, 414/937, 940, 416.03, 416.08; 118/719

(56) References Cited

U.S. PATENT DOCUMENTS

| | | | |
|---|---|---|---|
| 5,647,724 A | 7/1997 | Davis, Jr. et al. ......... | 414/744.5 |
| 5,789,878 A | 8/1998 | Kroeker et al. ............... | 318/45 |
| 5,837,059 A | 11/1998 | Glants ......................... | 118/733 |
| 5,993,141 A | 11/1999 | Wytman ................... | 414/744.2 |
| 6,102,164 A | 8/2000 | McClintock et al. ....... | 187/367 |
| 6,257,827 B1 | 7/2001 | Hendrickson et al. ...... | 414/805 |
| 6,450,755 B1 * | 9/2002 | Cameron et al. ...... | 414/416.08 |
| 2003/0012624 A1 * | 1/2003 | Kennard et al. ............ | 414/217 |

* cited by examiner

Primary Examiner—Donald P Walsh
Assistant Examiner—Kenneth W Bower
(74) Attorney, Agent, or Firm—Dugan & Dugan, LLP

(57) ABSTRACT

A multi-set robot is provided that includes a first robot set having a first motor coupled to a first rotatable member that is rotatable about an axis; a second motor coupled to a second rotatable member that is rotatable about the axis; a first plurality of blades vertically spaced from one another; and a first linkage adapted to enable coordinated movement of the blades on rotation of the first and second rotatable members. The robot also includes a second robot set positioned above the first robot set having a third motor coupled to a third rotatable member that is rotatable about the axis; a fourth motor coupled to a fourth rotatable member that is rotatable about the axis; a second plurality of blades vertically spaced from one another; and a second linkage adapted to enable coordinated movement of the blades on rotation of the third and fourth rotatable members. Other aspects are provided.

14 Claims, 13 Drawing Sheets

ROBOT FOR HANDLING SEMICONDUCTOR WAFERS

The present application is a continuation-in-part of U.S. patent application Ser. No. 09/549,777, filed Apr. 14, 2000, which is hereby incorporated by reference herein in its entirety.

FIELD OF THE INVENTION

This invention relates to an automatically controlled robot (mechanical mechanism) having substantially improved capacity for transferring semiconductor wafers between stations in processing equipment for the manufacture of semiconductors.

BACKGROUND OF THE INVENTION

In the manufacture of semiconductors, such as integrated circuits (ICs), dynamic random access memories (DRAMs), etc., large thin wafers (typically of silicon) from which the semiconductors are fabricated must frequently be transferred from one processing chamber to another. This transfer of wafers must be carried out under conditions of absolute cleanliness and often at sub-atmospheric pressures. To this end various mechanical arrangements have been devised for transferring wafers to and from processing chambers in a piece of equipment or from one piece of equipment to another.

It is the usual practice to load wafers into a cassette so that a number of them can be carried under clean-room conditions safely and efficiently from one place to another. A cassette loaded with wafers is then inserted into an input/output (I/O) chamber ("load lock" chamber) where a desired gas pressure and atmosphere can be established. The wafers are fed one-by-one to or from their respective cassettes into or out of the I/O chamber. It is desirable from the standpoint of efficiency in handling of the wafers that the I/O chamber be located in close proximity to a number of processing chambers to permit more than one wafer to be processed nearby and at the same time. To this end two or more chambers are arranged at locations on the periphery of a transfer chamber which is hermetically sealable and which communicates with both the I/O chamber and the processing chambers. Located within the transfer chamber is an automatically controlled wafer handling mechanism, or robot, which takes, wafers supplied from the I/O chamber and then transfers each wafer into a selected processing chamber. After processing in one chamber a wafer is withdrawn from it by the robot and inserted into another processing chamber, or returned to the I/O chamber and ultimately a respective cassette.

Semiconductor wafers are by their nature fragile and easily chipped or scratched. Therefore they are handled with great care to prevent damage. The robot mechanism which handles a wafer holds it securely, yet without scratching a surface or chipping an edge of the brittle wafers. The robot moves the wafer smoothly without vibration or sudden stops or jerks. Vibration of the robot can cause abrasion between a robot blade holding a wafer and a surface of the wafer. The "dust" or abraded particles of the wafer caused by such vibration can in turn cause surface contamination of other wafers, an undesirable condition. As a result the design of a robot requires careful measures to insure that the movable parts of the robot operate smoothly without lost motion or play, with the requisite gentleness in holding a wafer, yet be able to move the wafer quickly and accurately between locations. Because of these complex requirements, previous robot mechanisms have been unable to handle more than one wafer at a time in the limited space provided within a reasonably sized transfer chamber. It is desirable to provide a robot able to independently handle multiple wafers at the same time thereby increasing the through-put of a wafer-processing apparatus. It is also desirable to be able to place such a multiple-wafer-capacity robot within substantially the same size of transfer chamber as used with previous robots. This also permits ease of fitting a multiple-wafer-capacity robot into wafer processing apparatus of prior design and size.

SUMMARY OF THE INVENTION

In a first aspect of the invention, a multi-set robot is provided that is adapted to transfer multiple substrates. The multi-set robot includes a first robot set having (1) a first motor coupled to a first rotatable member that is rotatable about an axis of rotational symmetry; (2) a second motor coupled to a second rotatable member that is rotatable about the axis of rotational symmetry; (3) a first plurality of blades vertically spaced from one another and each adapted to support a substrate; and (4) a first linkage adapted to enable coordinated movement of the first plurality of blades on rotation of the first and second rotatable members. The multi-set robot also includes at least a second robot set positioned above the first robot set having (1) a third motor coupled to a third rotatable member that is rotatable about the axis of rotational symmetry; (2) a fourth motor coupled to a fourth rotatable member that is rotatable about the axis of rotational symmetry; (3) a second plurality of blades vertically spaced from one another and each adapted to support a substrate; and (4) a second linkage adapted to enable coordinated movement of the second plurality of blades on rotation of the third and fourth rotatable members.

In another aspect of the invention, a processing tool for use in semiconductor device fabrication is provided. The processing tool includes (1) a transfer chamber; (2) a load-lock coupled to the transfer chamber and adapted to provide substrates to the transfer chamber; (3) a first plurality of processing chambers coupled to the transfer chamber and adapted to receive substrates from the transfer chamber at a first elevation or lower; and (4) a second plurality of processing chambers coupled to the transfer chamber and adapted to receive substrates from the transfer chamber at an elevation above the first elevation. The processing tool also includes a transfer mechanism located within the transfer chamber and having (1) a first robot set adapted to rotate about an axis and to transfer substrates between the first plurality of processing chambers; and (2) a second robot set positioned above the first robot set and adapted to rotate about the axis and to transfer substrates between the second plurality of processing chambers independent of the first robot set. Numerous other aspects are provided, as are systems and methods.

The drawings are not necessarily to scale.

DETAILED DESCRIPTION

Figure 1:
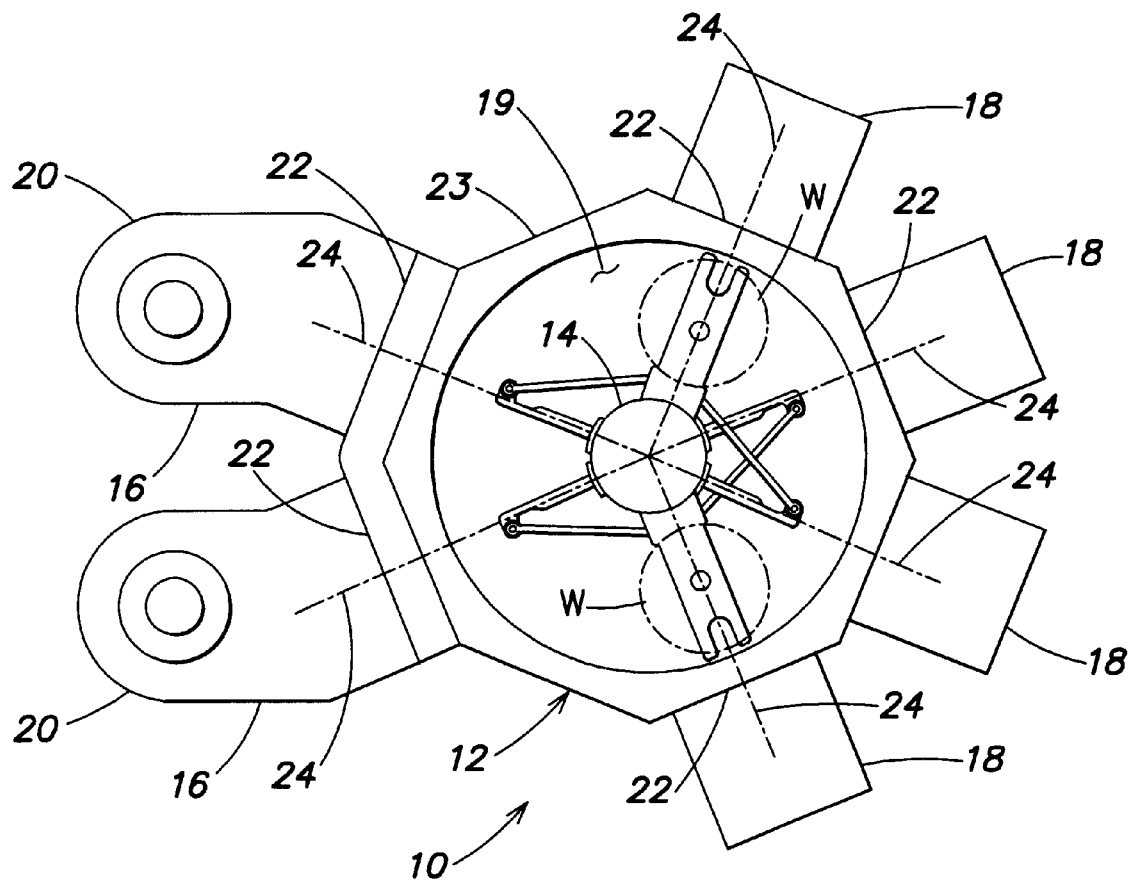
FIG. 1 is a schematic plan view partially broken away of a semiconductor wafer processing apparatus which includes a transfer chamber which houses an improved wafer-handling robot embodying features of the invention, together with an input/output (I/O) chamber and a plurality of processing chambers positioned around the periphery of the transfer chamber.

Referring now to FIG. 1, there is shown a schematic plan view, partially broken away, of a semiconductor wafer processing apparatus 10 including a transfer chamber 12, an improved wafer-handling robot 14 embodying features of the invention and contained within the transfer chamber 12, input/output (I/O) chambers 16 joined to the transfer chamber 12 at the periphery thereof, and four processing chambers 18 likewise joined to the transfer chamber 12 along its periphery. The I/O chambers 16 and the processing chambers 18 are well known in the art, as is the basic structure of the transfer chamber 12. The robot 14 is not limited to use with particular kinds and numbers of such chambers. The robot 14 by way of example is attached to a floor or bottom wall 19 of the transfer chamber 12 and is sealed around an access opening (not shown here) in the floor 19 as will be explained hereinafter. A top wall or cover which covers the transfer chamber 12 is not shown. While shown here as circular, the transfer chamber 12 in certain applications may be elliptical.

The I/O chambers 16, as illustrated here, are adapted to have attached to them respective wafer-holding cassettes 20, two of which are shown, and each of which is capable of holding a number of wafers (not shown) on closely spaced vertical levels, or shelves, within the cassette. The cassettes 20, as explained previously, provide a desirable way of carrying the wafers in clean-room condition from one piece of equipment, such as the apparatus 10 to and from another location. Within each I/O chamber 16 is a mechanism (not shown and well known in the art) for moving a selected wafer on its respective shelf in a cassette 20 to a designated level at which the robot 14 can remove the wafer from the I/O chamber 16. The robot 14 then brings the wafer into the transfer chamber 12 for subsequent insertion into a selected one of the processing chambers 20. After processing, a wafer is removed by the robot 14 from a processing chamber 18 and returned to a selected I/O chamber 16 and thence to its respective level in a cassette 20. Two wafers W, indicated in dotted outline in FIG. 1, are shown being held by the robot 14. By way of example, a wafer W can be 300 millimeters (mm) in diameter, though the invention is not limited to use with any particular diameter of wafer. The I/O chambers 16 and the transfer chamber 12 are hermetically sealed off from each other by "slit valve" slots 22, one for each cassette 20, which slots 22 are located in a peripheral wall 23 of the transfer chamber 12 and are automatically opened and closed to permit the transfer of wafers to or from the chambers. Such slit valve slots 22 are well known in the art and are not further described herein. Similar slit valve slots 22 seal the transfer chamber 12 from the respective processing chambers 18. The slit valve slots 22 are, by way of example, shown located at respective radii, indicated by dashed lines 24, in the wall 23 at the respective entrances to the I/O chambers 16 and the processing chambers 18.

Figure 2:
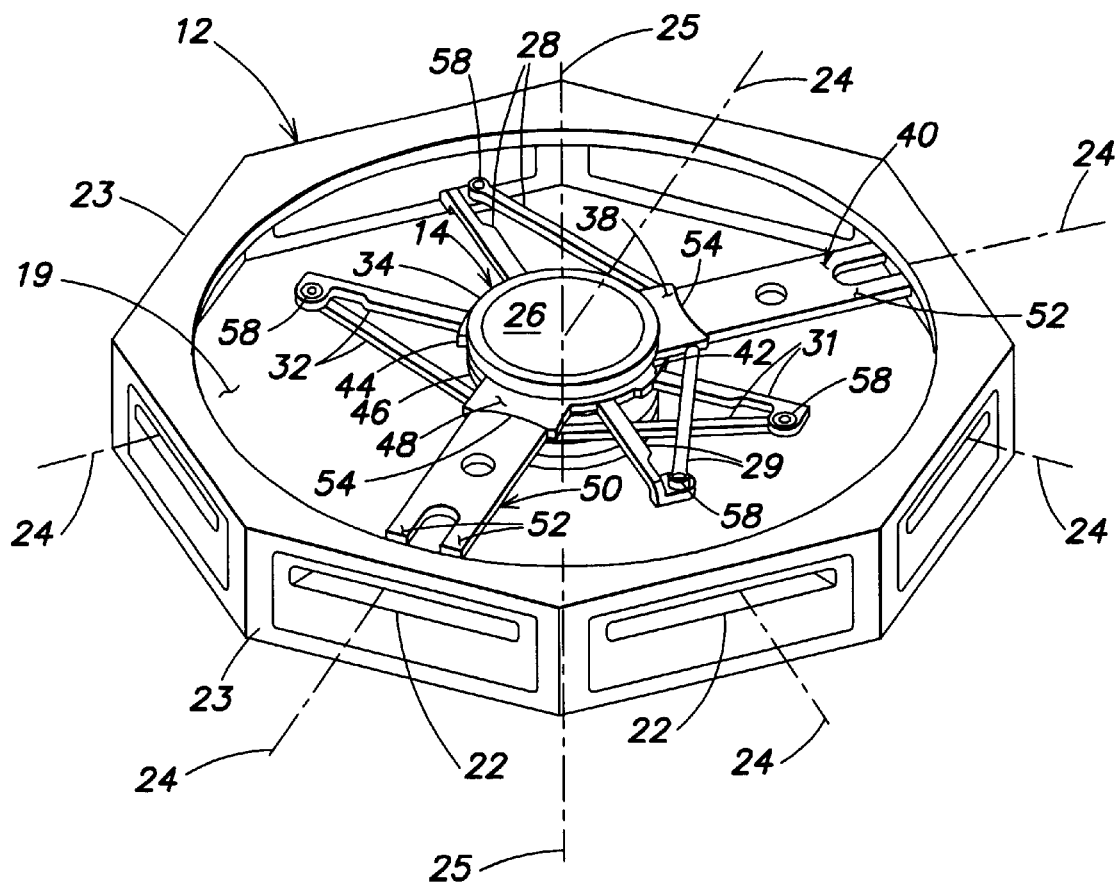
FIG. 2 is a perspective view partially broken away of a portion of the transfer chamber and of the improved robot embodying features of the invention.

Referring now to FIG. 2, there is shown partially broken away a perspective view of the transfer chamber 12 and of the robot 14 embodying features of the invention. The I/O chambers 16 and the processing chambers 18 are not shown. The robot 14 is aligned along a vertical center axis 25 and comprises a hub 26, an upper or first pair of extendable arms 28 and 29 and a lower or second pair of substantially identical arms 31 and 32 which are inverted or turned upside down relative to the first pair of arms. This permits the pairs of arms to be spaced closely together in the vertical direction in parallel, horizontal planes (see also FIG. 3). The inner ends of the upper arms 28 and 29 are rigidly fixed respectively to an upper pair of separately rotatable narrow ring-like bodies 34 and 36 (see also FIG. 3), and the outer ends of these arms 28 and 29 are geared together by a wrist mechanism 38 which supports horizontally an upper wafer-holding blade 40 and holds it radially aligned. The lower pair of extendable arms 31 and 32 similarly have inner ends fixed respectively to a second, lower pair of narrow ring-like bodies 42 and 44 which are rotatable on bearings around the hub 26 and are spaced by a narrow-diameter vertical gap, indicated at 46 (see also FIG. 3), a short distance below the upper pair of ring-like bodies 34 and 36. The outer ends of the lower arms 31 and 32 are geared together by a wrist mechanism 48 which supports horizontally a lower wafer-holding blade 50 and holds it radially aligned. The two wafer-holding blades 40 and 50 are aligned radially with the hub 26, though each blade is extendable or retractable, and also rotatable, independently of the other blade. Each blade 40 and 50 has a front lip 52 and a rear shoulder 54 which engage the rim or edge of a wafer W (see FIG. 1) and position it on a respective blade. A retractable detent or finger mechanism (not shown) at each rear shoulder 54 of each blade 40 or 50, and contained respectively within the wrist mechanism 38 or 48, automatically engages the edge of a wafer W to help hold it in place when the wafer is being moved into or out of a chamber. Each detent mechanism is automatically disengaged by its wrist mechanism 38 or 48 to free the wafer to be lifted off of, or placed onto a respective blade 40 or 50 by further mechanism (not shown) when a blade is fully inserted into a chamber 16 or 18. The upper and lower pairs of arms 28, 29 and 31, 32 are shown in FIG. 2 folded with their respective wrist mechanisms 38 and 48 partially retracted into the vertical hub gap 46, thereby minimizing the inside diameter necessary for the transfer chamber 12. Each of the arms 28, 29 and 31, 32 is provided near its center with a respective one of four elbow bearings 58 which permit the arms to bend easily in their respective horizontal planes to a folded position as shown, but these bearing 58 resist vertical play or up-and-down lost motion of the outer portions of the respective arms 28, 29 and 31, 32.

Figure 3:
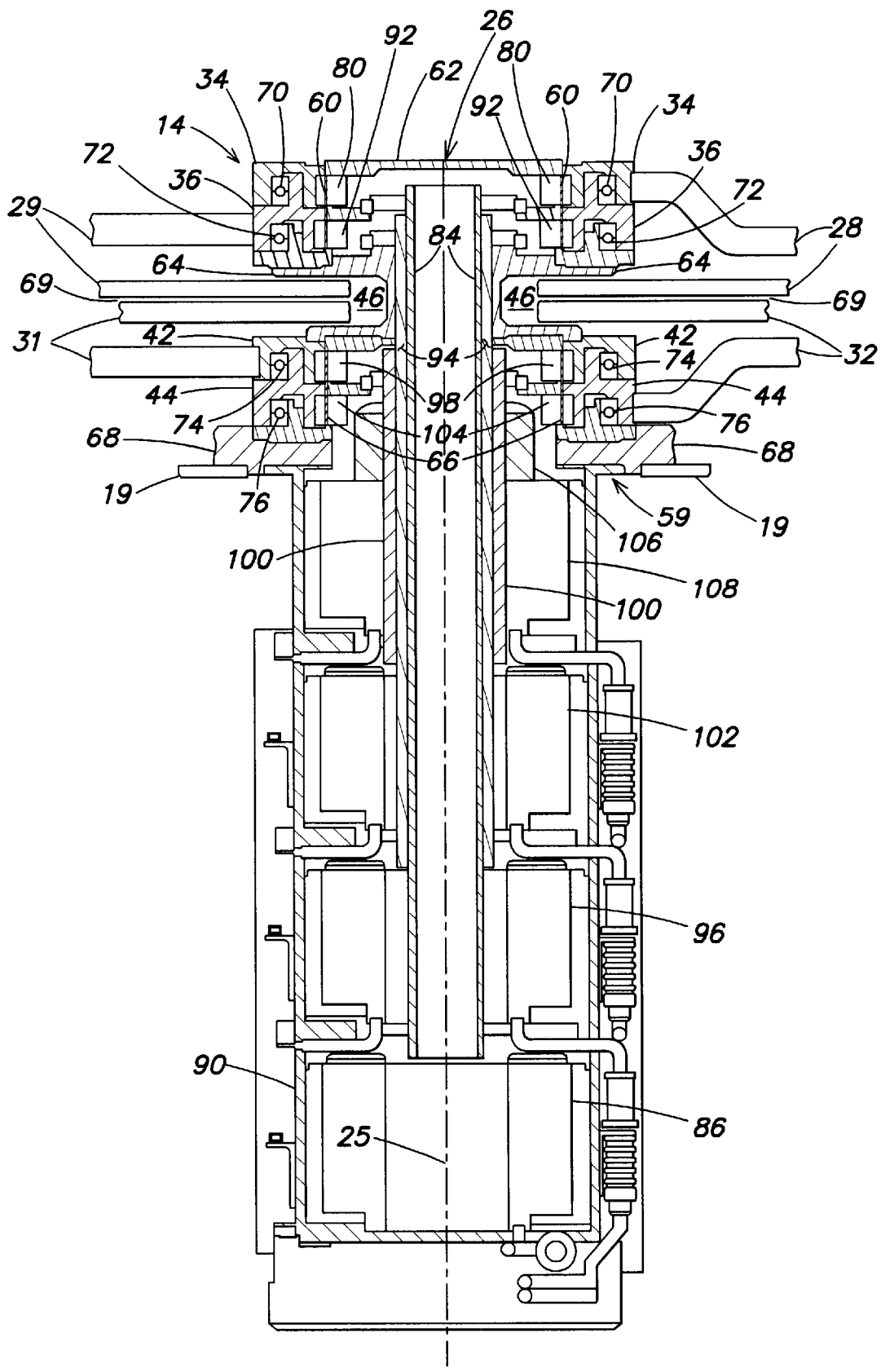
FIG. 3 is a schematic side view of the improved robot of FIG. 2 with portions broken away and other portions shown in cross-section.

The upper pair of arms 28, 29 can be extended (for example along one of the radii 24) to move its blade 40 through a selected slit valve slot 22 (and into one of the chambers 16, and 18) by rotating the ring-like bodies 34 and 36, by which the arms are supported, incrementally in opposite directions relative to each other and by the same amount (see also FIG. 3). Thus, rotating the body 34 counterclockwise about the axis 25 and at the same time rotating the body 36 clockwise will straighten out the arms 28 and 29 until they are nearly parallel to each other. This fully extends the wafer-holding blade 40 outward from the hub 26 along a radius 24 and through a selected slit valve slot 22. Thereafter the arms 28 and 29 by opposite action of the ring-like bodies 34, 36 are folded back to the position shown to retract the blade 40 and permit it to be rotated to a different angular position for insertion into a selected chamber 16 or 18. The wafer-holding blade 50 and the arms 31, 32 are similarly controlled by selective rotation of their respective ring-like bodies 42 and 44. Because the separate horizontal blades 40 and 50 are so closely spaced vertically, each blade (and a wafer being held by it) can easily pass horizontally without interference through any slit valve slot 22. The ordered sequencing in operations of the robot 14, and its arms 28, 29 and 31, 32 and the slit valve slot 22 is controlled by a computer (not shown) and is well known in the art.

Referring now to FIG. 3, there is shown a schematic side view of the robot 14, provided according to the invention, with portions broken away, other portions in cross-section, and still other portions schematically shown. The bottom of the hub 26 of the robot 14 is sealed around a circular access opening, indicated at 59, in the floor 19 of the transfer chamber 12 (not otherwise shown here). The hub 26 near its top has first a thin, cylindrical vertical wall 60 of non-magnetic material such as aluminum, on top of which is fixed a sealing plate 62. The bottom end of the thin wall 60 is fixed (and sealed to) an annular member 64 which forms the hub gap 46 (see also FIG. 2). The bottom end of the annular member 64 is sealed to the upper end of a second, thin cylindrical vertical wall 66 (also non-magnetic), axially aligned with the first wall 60. The lower end of the second wall 66 is fixed and sealed to an annular disc 68 which in turn is sealed to the chamber floor 19 around the opening 59.

The upper arms 28, 29 and the lower arms 31, 32 (shown partially broken away in FIG. 3) are substantially identical but are inverted relative to each other. These arms along their outer portions have horizontal flat surfaces which as shown in FIG. 3 face each other and are separated by a small vertical space indicated at 69. This close spacing 69 permits the arms (and their respective wrists 38 and 48) to partially recess in the hub gap 46 (see also FIG. 2). The wafer-holding blades 40 and 50 (not shown in FIG. 3) are also close enough together, with respect to the vertical direction, that both of these blades easily fit through the slit valve slot 22 (see FIG. 2), as was mentioned previously.

The topmost rotatable ring-like body 34, to which is fixed the arm 28 (see also FIG. 2), is rotatably supported on the hub 26 by a bearing assembly 70 which in turn is supported by an upper portion of the ring-like body 36 (to which the arm 29 is attached). The body 36 is rotatably supported by a bearing assembly 72 in turn supported by a fixed portion of the hub 26 just above the annular member 64. The ring-like bodies 34 and 36 are thus able to rotate independently and opposite of each other, or in unison together, as was described previously. The two lower ring-like bodies 42 and 44 (attached to the arms 31, 32) are rotatably supported in a substantially identical way by a bearing assembly 74 and a bearing assembly 76, and are similarly operable.

The topmost ring-like body 34 is rotatably coupled through the thin hub wall 60 (transparent to a magnetic field) via a magnetic coupling assembly 80 to the upper end of a vertical rotatable drive shaft 84, aligned with the axis 25, and extending downward through the hub 26 and through the opening 59 in the chamber floor 19 to a first servo motor 86. The motor 86 is held within a vertical support frame 90 attached to the floor 19; a rotatable part of the motor 86 drives the shaft 84 in either direction and positions it (and the ring-like body 34) with great angular precision. The magnetic coupling assembly 80 (well known in the art) tightly couples the rotation of the shaft 84 to the ring-like body 34 SO that there is no angular play or error in the rotation of the body 34. The thin wall 60, and the thin wall 66, provide an hermetic seal between the rotating members inside and outside of the hub 26. In substantially identical fashion described above with respect to the ring-like body 34, the ring-like body 36 is rotationally coupled by a magnetic coupling assembly 92 to the upper end of a shaft 94 which extends downward to a servo motor 96; the ring-like body 42 is rotationally coupled via a magnetic coupling assembly 98 to the upper end of a shaft 100 which extends downward to a servo motor 102; and the ring-like body 44 is rotationally coupled via a magnetic coupling assembly 104 to a short vertical shaft 106 which extends downward to a servo motor 108. The magnetic coupling assemblies 80, 92, 98 and 104 are substantially identical to each other. The shafts 84, 94, 100 and 106 are concentric with each other, are aligned with the axis 25, and are independently rotatable. The servo motors 86, 96, 102 and 108 are identical to each other, are independently rotatable, have hollow cores through which certain of the shafts 84, 94, 100 and 106 can pass, and are supported on the frame 90. These servo motors are commercially available. Bearings associated with the respective motors and shafts are not shown. The operation of these motors is controlled by a computer (not shown) and is well known in the art.

Figure 4:
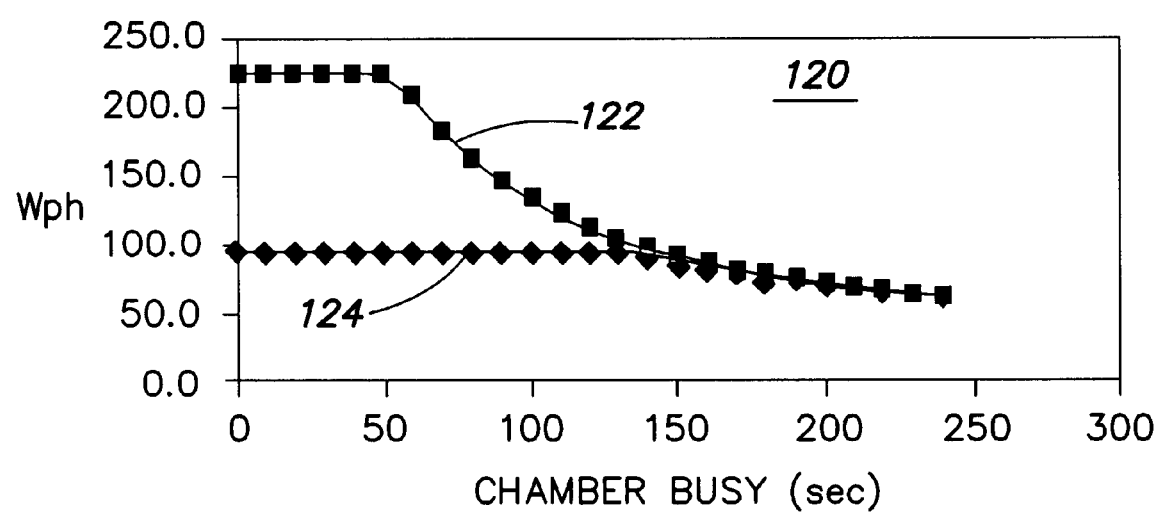
FIG. 4 is a graph showing the improvement in wafer handling capability obtained by the improved robot embodying features of the present invention compared to the capability of a prior art robot having similar operating characteristics.

Referring now to FIG. 4, there is shown a graph 120 with a vertical axis showing values of wafer throughput per hour (Wph) and a horizontal axis showing "chamber busy" time in seconds for a wafer processing apparatus having four processing chambers. The values of "Wph" are calculated using a combination of "chamber busy" times and times needed to transfer wafers between chambers. The graph 120 has a first curve 122 showing the improved productivity of an apparatus (such as the apparatus 10) utilizing an improved dual-wafer-handling robot (able to handle two wafers simultaneously such as the robot 14) provided by the invention, and a second curve 124 showing "Wph" of a similar apparatus but with a single-wafer-handling robot (able to handle only one wafer at a time). Below about 100 seconds of chamber busy time, the wafer throughput (Wph) provided by a robot embodying the invention, as indicated by the curve 122, is markedly superior to the wafer throughput of a robot without the invention, as indicated by the curve 124. And below about 50 seconds busy time, the wafer throughput provided by the invention is more than twice as great as throughput without the invention.

Figures 5A, 5B:
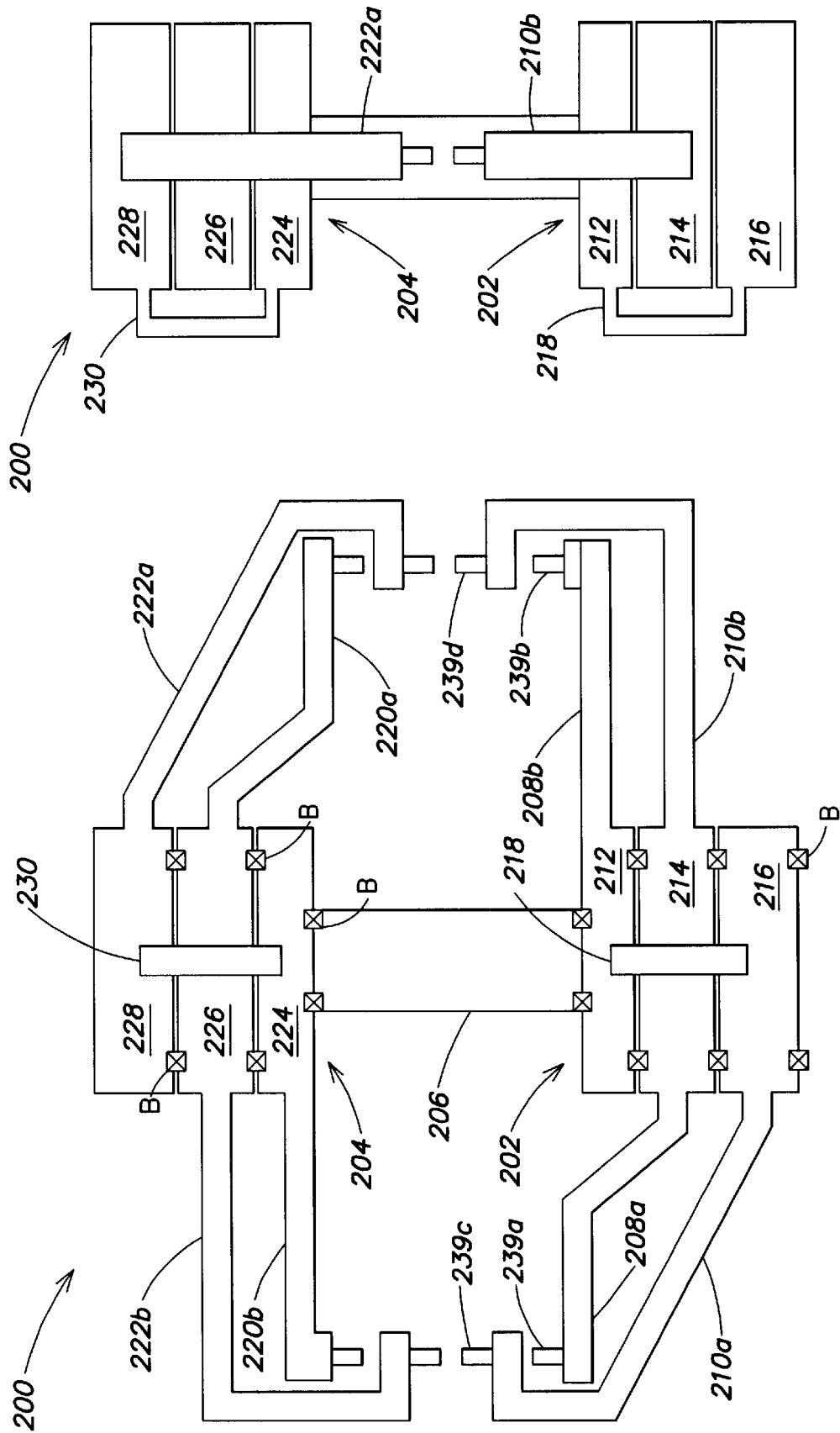
FIGS. 5A and 5B are a schematic front view and a schematic side view, respectively, of a multi-set robot configured in accordance with another aspect of the invention.

FIGS. 5A and 5B are a schematic front view and a schematic side view, respectively, of a multi-set robot 200 configured in accordance with another aspect of the invention. The multi-set robot 200 of FIG. 5A is similar to the robot 14 of FIGS. 1 and 2, but rather than having two pairs of arms (arms 28, 29 forming one pair and arms 31, 32 forming another pair in FIG. 2) which move independently, the multi-set robot 200 of FIG. 5A employs two "robot sets" that move independently. Each robot set includes a pair of arms that employ coordinated movement as described further below.

Referring to FIGS. 5A and 5B, the multi-set robot 200 includes a first robot set 202 coupled to a second robot set 204 via a spool 206. The first robot set 202 may be coupled, for example, to the floor or bottom wall of a transfer chamber (e.g., such as the floor 19 of the transfer chamber 12 of FIG. 2) and sealed around an access opening (described below) of the transfer chamber. The spool 206 has a hollowed out region (described below) which is similarly sealed from an atmosphere of a transfer chamber or other apparatus in which the multi-set robot 200 is employed (e.g., via o-rings, welds or other conventional seals between the spool 206 and the robot sets 202, 204). The spool 206 may be formed from aluminum, although other materials may be employed.

The first robot set 202 includes a first arm assembly that includes a first pair of arms 208a, 208b and a second arm assembly that includes a second pair of arms 210a, 210b. The first robot set 202 further includes a first rotatable ring 212 rotatably coupled to the spool 206, a second rotatable ring 214 rotatably coupled to the first rotatable ring 212 and a third rotatable ring 216 rotatably coupled to the second rotatable ring 214. The spool 206 and/or the rotatable rings 212–214 may be rotatably coupled by one or more conventional bearings B or other rotational mechanisms. A first connecting member 218 couples the first rotatable ring 212 and the third rotatable ring 216 so that these rings rotate together as a unit. As shown in FIG. 5A, the arm 208a and the arm 210b are coupled to the second rotatable ring 214, the arm 208b is coupled to the first rotatable ring 212 and the arm 210a is coupled to the third rotatable ring 216.

The second robot set 204 similarly includes a third arm assembly that includes a third pair of arms 220a, 220b and a fourth arm assembly that includes a fourth pair of arms 222a, 222b; and a fourth rotatable ring 224 rotatably coupled to the spool 206, a fifth rotatable ring 226 rotatably coupled to the fourth rotatable ring 224 and a sixth rotatable ring 228 rotatably coupled to the fifth rotatable ring 226. A second connecting member 230 couples the fourth rotatable ring 224 and the sixth rotatable ring 228 so that these rings rotate as a unit. The arm 220a and the arm 222b are coupled to the fifth rotatable ring 226, the arm 220b is coupled to the fourth rotatable ring 224 and the arm 222a is coupled to the sixth rotatable ring 228. As shown in FIG. 5A, the second robot set 204 is essentially identical to the first robot set 202, but rotated by 180°.

Figure 6:
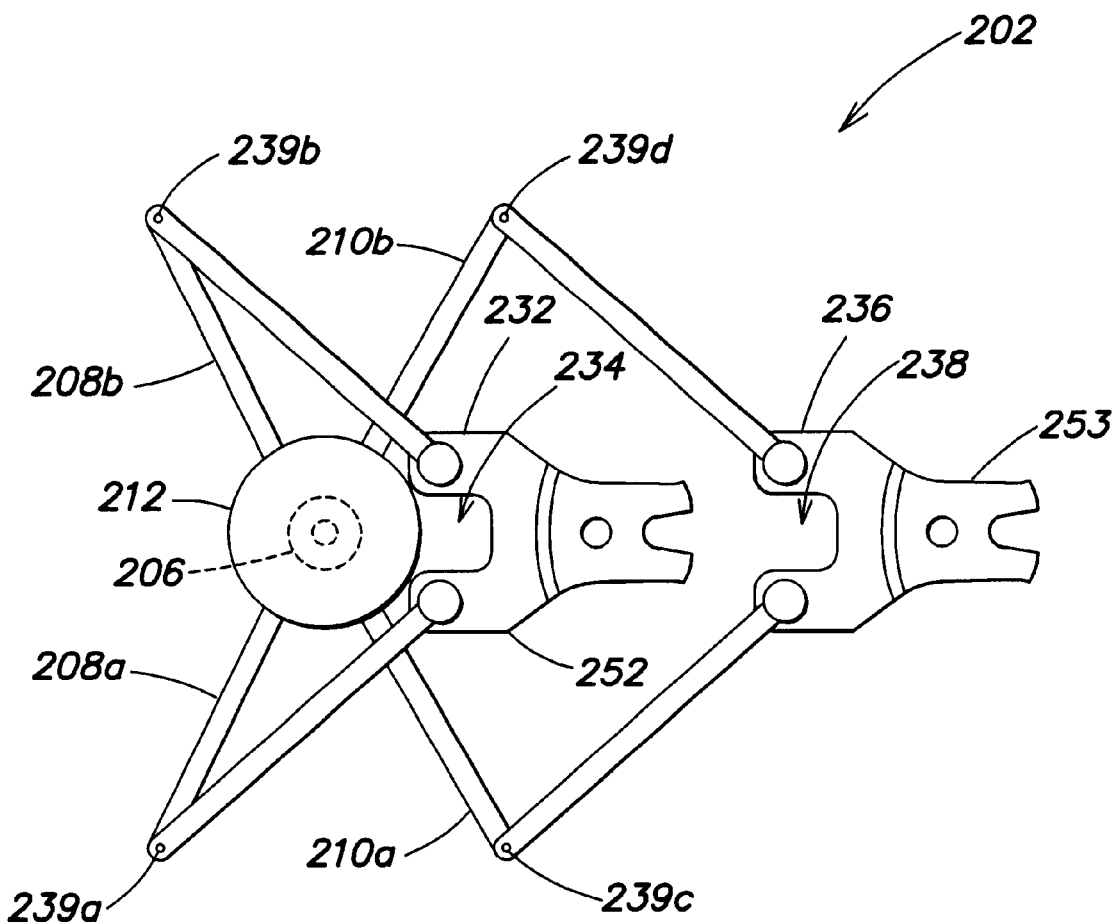
FIG. 6 is a top plan view of the first robot set of FIGS. 5A and 5B.

FIG. 6 is a top plan view of the first robot set 202 of FIGS. 5A and 5B. As shown in FIG. 6, the arms 208a, 208b are coupled via a first inventive wrist 232 which has a cut-out region 234. The arms 210a, 210b are similarly coupled via a second wrist 236 which has a cut-out region 238. As described further below, the cut-out regions 234, 238 allow the first robot set 202 to fully retract despite the presence of the spool 206 (allowing full range of motion of the robot set 202). As shown in FIGS. 5A and 6, each arm 208a, 208b, 210a, and 210b includes multiple arm sections that are pivotally connected by pivots 239a–d, respectively.

Figure 7:
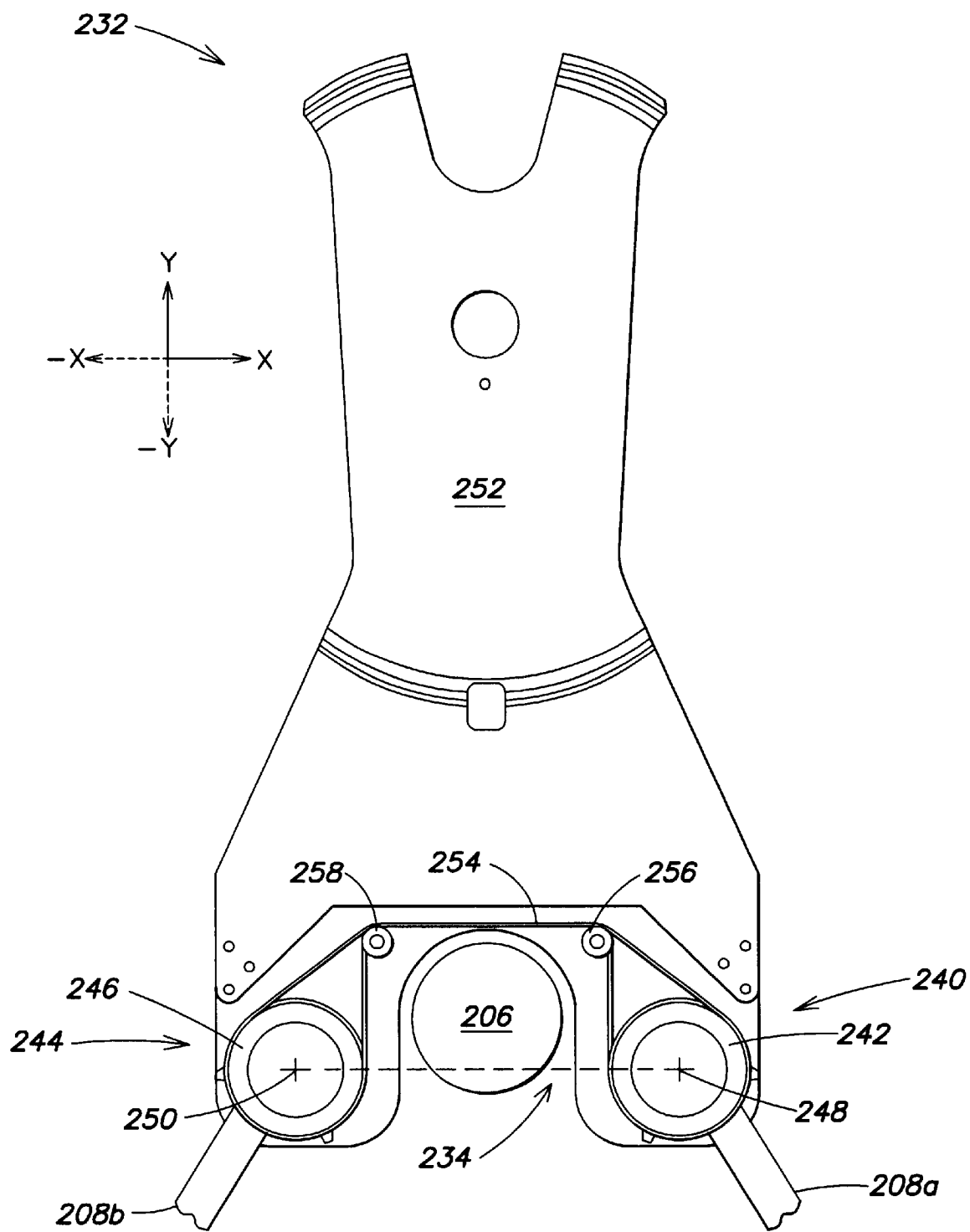
FIG. 7 is a top plan view of an exemplary embodiment of the first wrist of FIG. 6, which also shows a portion of the spool of FIGS. 5A and 5B.

FIG. 7 is a top plan view of an exemplary embodiment of the first wrist 232 of FIG. 6, which also shows a portion of the spool 206 of FIGS. 5A and 5B. As shown in FIG. 7, the first wrist 232 includes a first pivot mechanism 240 having a first ring 242 adapted to (rigidly) couple to the arm 208a and a second pivot mechanism 244 having a second ring 246 adapted to (rigidly) couple to the arm 208b. The first ring 242 is adapted to rotate about a first pivot 248 and the second ring 246 is adapted to rotate about a second pivot 250, and both pivots are rigidly coupled to a blade 252 (adapted to support a substrate). A belt 254 is coupled between the first and second rings 242, 246 and is directed by a first wheel 256 and a second wheel 258 around the cut-out region 234 as shown. As stated (and as described further below), the cut-out region 234 allows the wrist 232 to retract past the spool 206 (as shown in FIG. 7).

In operation, when the arm 208a is extend (as described below), the first ring 242 rotates (clockwise). In response to rotation of the first ring 242, the belt 254 causes the second ring 246 to rotate in the opposite direction (counterclockwise) of the first ring 242 (thereby causing the arm 208b to extend with the arm 208a). A similar, opposite action occurs during retraction of the arm 208a. In this manner, the arms 208a, 208b may extend (or retract) together without the blade 252 pivoting, wobbling or otherwise becoming cocked or skewed (e.g., the blade 252 travels in a straight line along a y-axis and does not pivot about an x-axis as shown in FIG. 7 during extension or retraction of the arms 208a, 208b). The second wrist 236 operates similarly with respect to the arms 210a, 210b. It will be understood that other mechanisms may be employed to control blade pivoting such as conventional gearing or the like.

Referring again to FIGS. 5A and 6, the operation of the first robot set 200 is now described. Specifically, the first robot set 200 is configured to extend the arms 208a, 208b (with the blade 252 and a wafer (not shown) supported thereon) while the arms 210a, 210b retract (with a blade 254 coupled to the wrist 236 and a wafer (not shown) supported thereon); and vice versa. Such "coordinated movement" is achieved as follows. First, to extend the arms 208a, 208b, the first rotatable ring 212 and the second rotatable ring 214 are rotated in opposite directions (clockwise and counterclockwise, respectively, in FIG. 6). In response thereto, the arms 208a, 208b extend, and the arms 210a, 210b retract (under the influence of the second rotatable ring 214 and the third rotatable ring 216). Likewise, to extend the arms 210a, 210b (as shown in FIG. 6), the third rotatable ring 216 is rotated counterclockwise and the second rotatable ring 214 is rotated clockwise. In response thereto, the arms 210a, 210b extend, and the arms 208a, 208b retract (under the influence of the second rotatable ring 214 and the first rotatable ring 212).

Although not shown in FIG. 6, when the arms 208a, 208b are fully retracted (and the arms 210a, 210b are fully extended), the wrist 232 will retract past the spool 206. Absent the cutout region 234, the wrist 232 would collide with the spool 206 during extension of the arms 210a, 210b, preventing full extension of the arms 210a, 210b. Similarly, absent the cutout region 238, the wrist 236 would collide with the spool 206 during extension of the arms 208a, 208b (preventing full extension of the arms 208a, 208b). Note that rotation of the first rotatable ring 212/third rotatable ring 216 and the second rotatable ring 214 in the same direction results in rotation of the first robot set 202.

The second robot set 204 is similarly configured with wrists having cut-out regions (not shown), and operates in a similar manner to (but independently from) the first robot set 202. Accordingly, operation of the second robot set 204 is not described herein.

As stated, the first and second robot sets 202, 204 may operate independently of one another. To achieve this, the first, second and third rotatable rings 212, 214 and 216 of the first robot set 202 are driven independently of the fourth, fifth and sixth rotatable rings 224, 226 and 228 of the second robot set 204.

Figure 8:
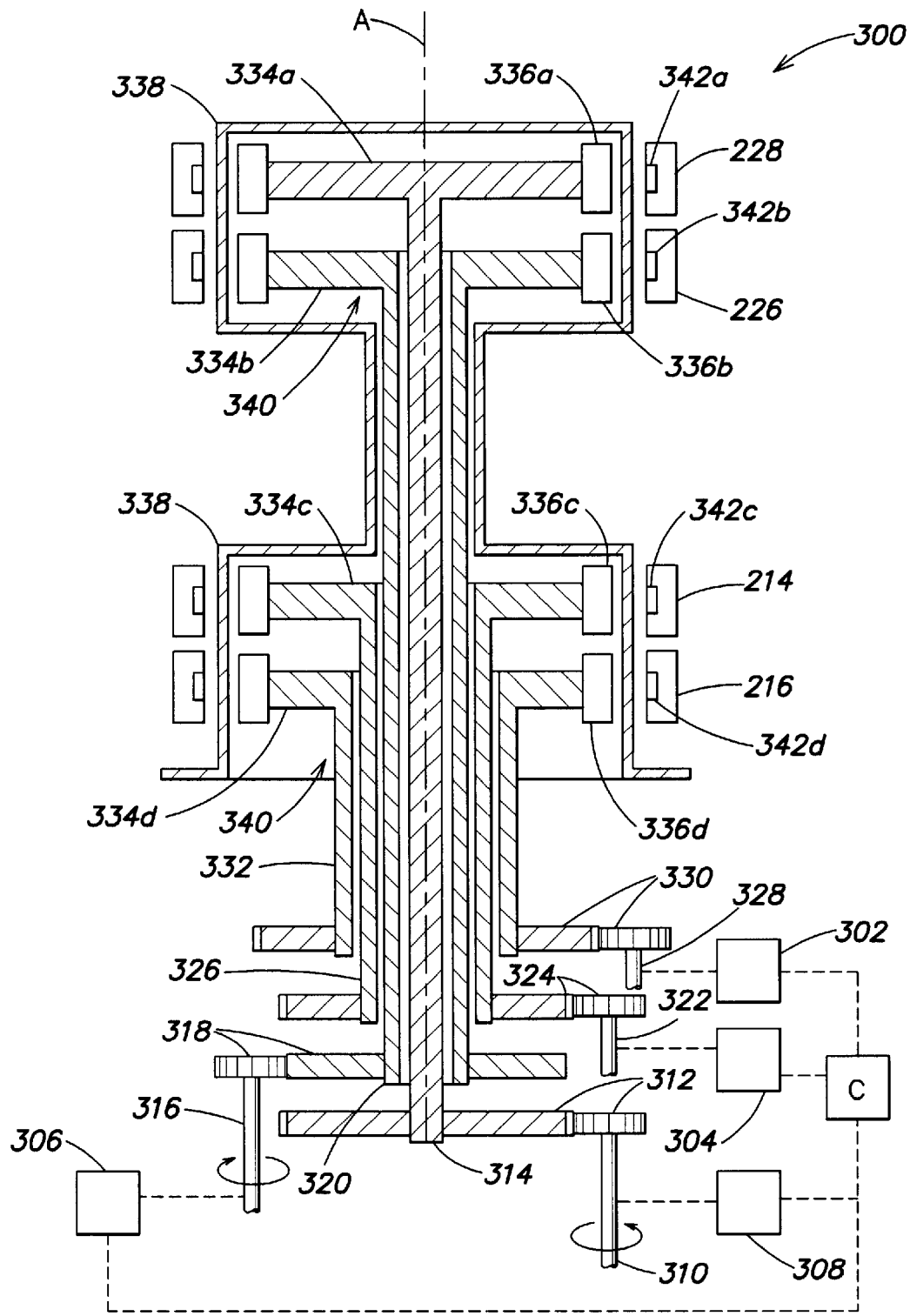
FIG. 8 illustrates one exemplary embodiment of a drive mechanism for the multi-set robot of FIGS. 5A and 5B that employs magnetic coupling in accordance with the present invention.

FIG. 8 illustrates one exemplary embodiment of a drive mechanism 300 for the multi-set robot 200 that employs magnetic coupling in accordance with the present invention. It will be understood that other drive mechanism configurations may be employed (e.g., direct coupling via gears or the like and/or the first rotatable ring 212 and/or the fourth rotatable ring 214 may be driven rather than or in addition to the third and sixth rotatable rings 216, 228).

The drive mechanism 300 includes a first motor 302, a second motor 304, a third motor 306 and a fourth motor 308. The fourth motor 308 is coupled (via a first drive shaft 310 and first gears 312) to a first rotatable shaft 314 positioned along an axis of rotational symmetry A. The third motor 306 is coupled (via a second drive shaft 316 and second gears 318) to a second rotatable shaft 320 which surrounds the first rotatable shaft 314. The second motor 304 is coupled (via a third drive shaft 322 and third gears 324) to a third rotatable shaft 326 which surrounds the second rotatable shaft 320. The first motor 302 is coupled (via a fourth drive shaft 328 and fourth gears 330) to a fourth rotatable shaft 332 which surrounds the third rotatable shaft 326. A controller C may be coupled to each motor and configured to drive each shaft 314–332, and thus each rotatable ring 212–228 as described below.

Each rotatable shaft 314, 320, 326 and 332 includes an extension arm 334a–d having magnets 336a–d coupled to an end thereof so as to position each magnet in close proximity with a thin wall housing 338 which surrounds the rotatable shafts 314, 320, 326 and 332. The thin wall housing 338 of the drive mechanism 300 may be adapted to couple to a floor of a semiconductor device fabrication chamber, such as the transfer chamber 12 of FIG. 1. Alternatively, the housing 338 may be adapted to couple to a lid or other top surface of a chamber. The housing 338 may be configured to seal an interior region 340 of the housing 338 from a vacuum environment of a transfer chamber in which the housing 338 is located. The housing 338 preferably comprises a non-magnetic material such as aluminum. Other suitable materials similarly may be employed. The spool 206 may be part of or separate from the housing 338.

With reference to FIG. 8, the second, third, fifth and sixth rotatable rings 214, 216, 226 and 228 are each provided with a magnet 342a–d (as shown) which aligns with the magnets 336a–d of the fourth, third, second and first rotatable shafts 314, 320, 326 and 332, respectively. The first and fourth rotatable rings 212, 224 (not shown in FIG. 8) need not be provided with magnets. To increase magnetic coupling effectiveness, each magnet may be positioned with its poles aligned vertically with pole pieces extending therefrom and toward the adjacent magnet to which it is coupled. The magnets which are coupled are flipped, magnetically, so that north pole to south pole coupling occurs at each pair of pole pieces located on either side of the thin walled housing 338.

In operation, the first and second motors 302, 304 may be employed to drive the third and second rotatable rings 216, 214, respectively, in the same or opposite directions to extend, retract and/or rotate the blades of the first robot set 202 as previously described. Recall that the first rotatable ring 212 rotates with the third rotatable ring 216. Likewise, the third and fourth motors 306, 308 may be employed to drive the sixth and fifth rotatable rings 228, 226, respectively, in a similar manner to extend, retract and/or rotate the blades of the second robot set 204. Most notably, the first robot set 202 may be operated completely independently of the second robot set 204. The fourth rotatable ring 224 rotates with the sixth rotatable ring 228.

Figure 9A:
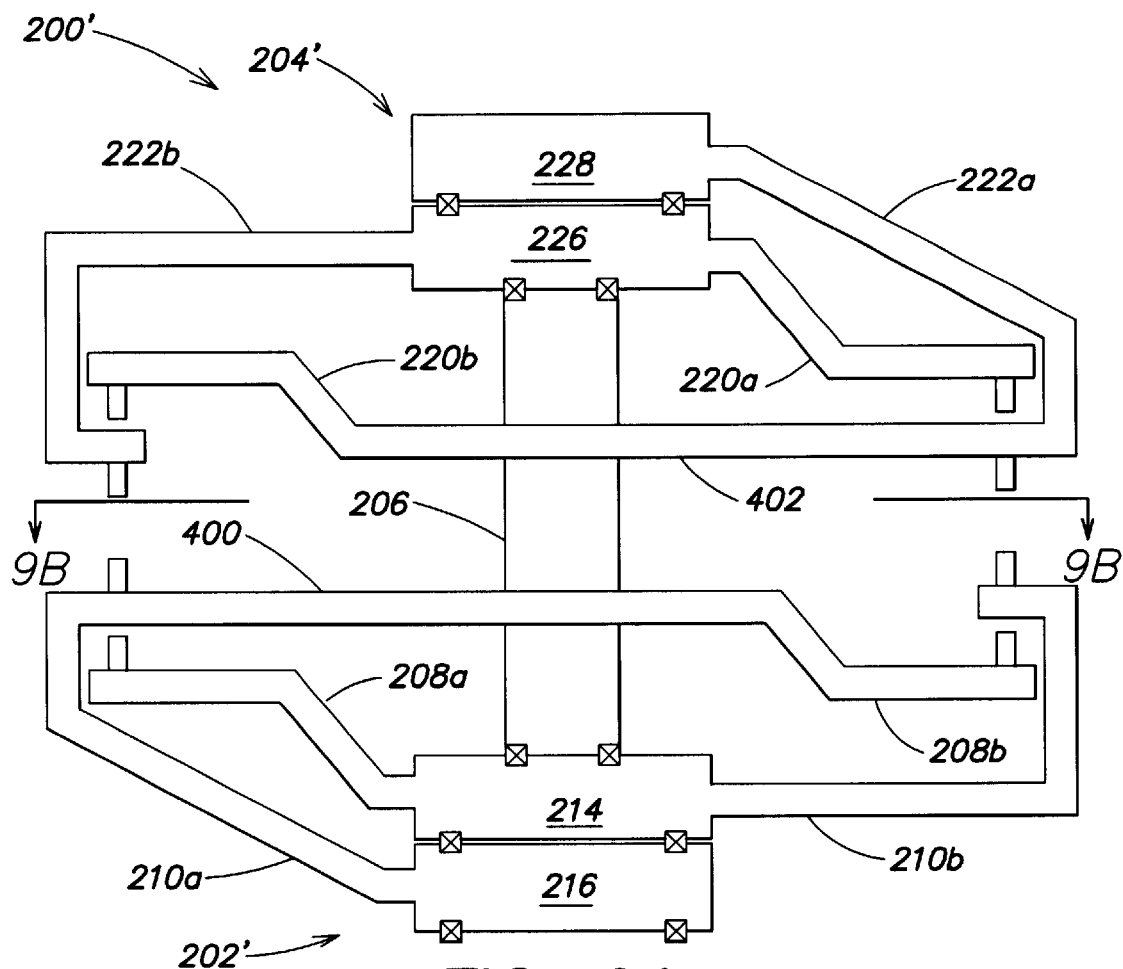
FIGS. 9A and 9B are a schematic front view and a schematic side view, respectively, of an alternative embodiment for the multi-set robot of FIGS. 5A and 5B.
Figure 9B:
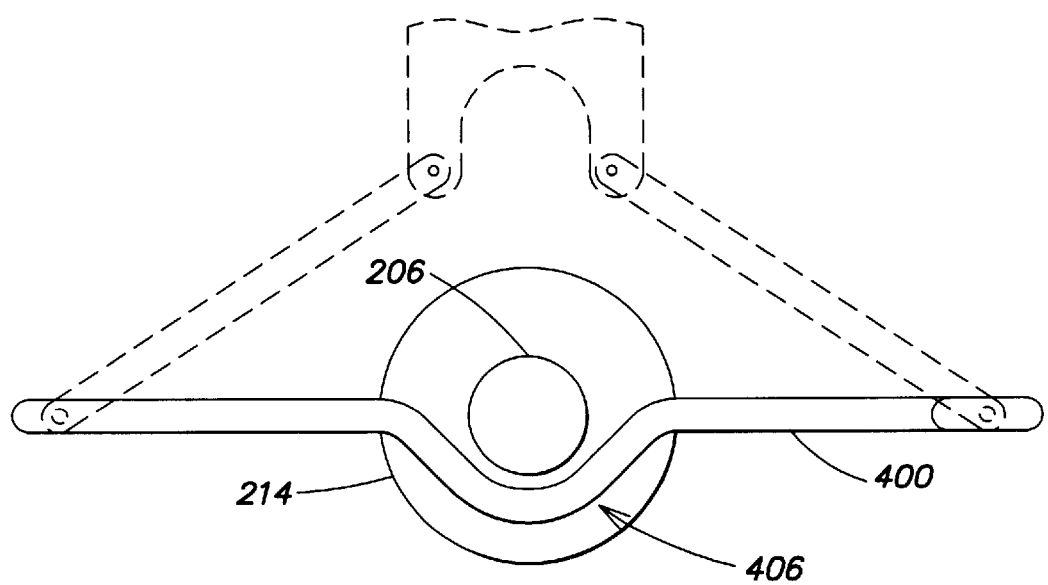

FIG. 9A is a schematic front view of an alternative embodiment for the multi-set robot 200 of FIGS. 5A and 5B (referred to herein as multi-set robot 200' for convenience). Only the relevant differences between the multi-set robots 200 and 200' are described.

With reference to FIGS. 5A and 9A, the first robot set of the multi-set robot 200' of FIG. 9A (first robot set 202') does not employ the first rotatable ring 212 and the second robot set of the multi-set robot 200' (second robot set 204') does not employ the fourth rotatable ring 224. Rather, the spool 206 is coupled to the second rotatable ring 214 and to the fifth rotatable ring 226 (as shown).

Within the first robot set 202', because the first rotatable ring 212 has been eliminated, the arm 208b is coupled to the third rotatable ring 216 via a first strut 400 (which couples to the third rotatable ring 216 by coupling to the arm 210a). Similarly, within the second robot set 204', the arm 220b is coupled to the sixth rotatable ring 228 via a second strut 402 which couples to the arm 222a. A similar arrangement for a single robot set is described in U.S. Pat. No. 5,789,878, which is hereby incorporated by reference herein in its entirety.

To accommodate the spool 206 which separates the first and second robot sets 202', 204', each strut 400, 402 is shaped to allow it to move past the spool 206. For example, FIG. 9A is a top plan view of the strut 400 of FIG. 9A taken along line 9B—9B in FIG. 9A which shows the strut 400 with a bend 406 in an area of the strut 400 that would otherwise contact the spool 206. It will be understood that other strut shapes may be employed to accommodate the spool 206.

As with the multi-set robot 200 of FIG. 5A, the multi-set robot 200' may employ the drive mechanism 300 of FIG. 8 and/or wrists having cut-out regions as shown in FIGS. 6 and 7. The multi-set robot 200' of FIG. 9A is operated (e.g., is driven) in a manner similar to that of the multi-set robot 200 of FIG. 5A.

Figure 10A:
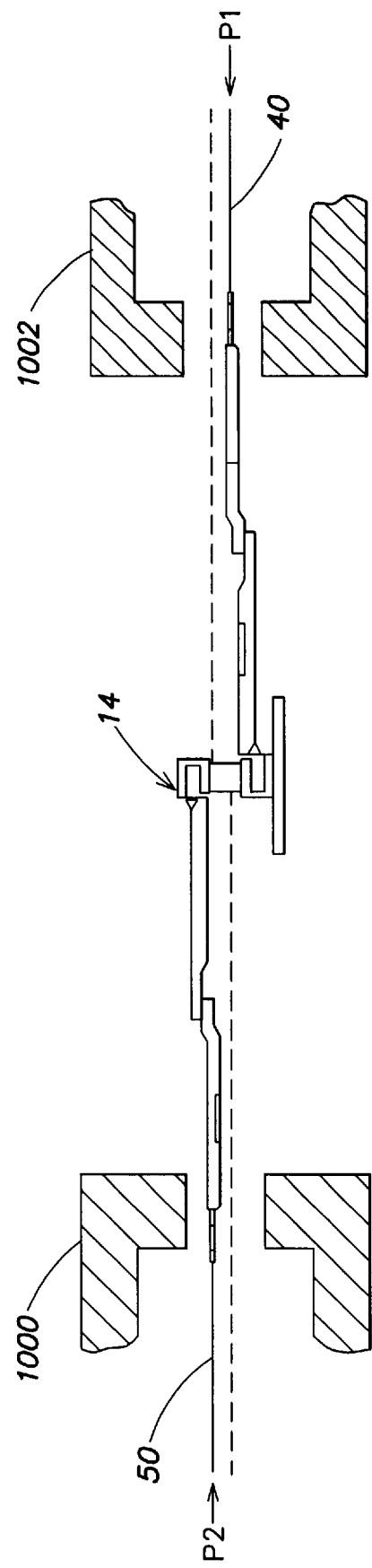
FIG. 10A is a schematic side view of the robot of FIGS. 1 and 2 during wafer transfer within a first processing chamber and a second processing chamber.

FIG. 10A is a schematic side view of the robot 14 of FIGS. 1 and 2 during wafer transfer within a first processing chamber 1000 and a second processing chamber 1002. As shown in FIG. 10A, each blade 40, 50 of the robot 14 travels in a different plane during extension and retraction (planes P1 and P2, respectively). As stated previously, in accordance with at least one embodiment, because of the arrangement of the arms 28, 29, 31 and 32, the blades 40, 50 may be positioned closely together (as shown in FIG. 3). The planes P1 and P2 thereby are close together, and in most cases, both planes can be accommodated within an opening (e.g., slit, chamber port, etc.) of a typical processing chamber such as is shown for the processing chambers 1000, 1002 of FIG. 10A. However, this may not be the case when the multi-set robot 200 or 200' of FIGS. 5A and 9A is employed.

Figure 10B:
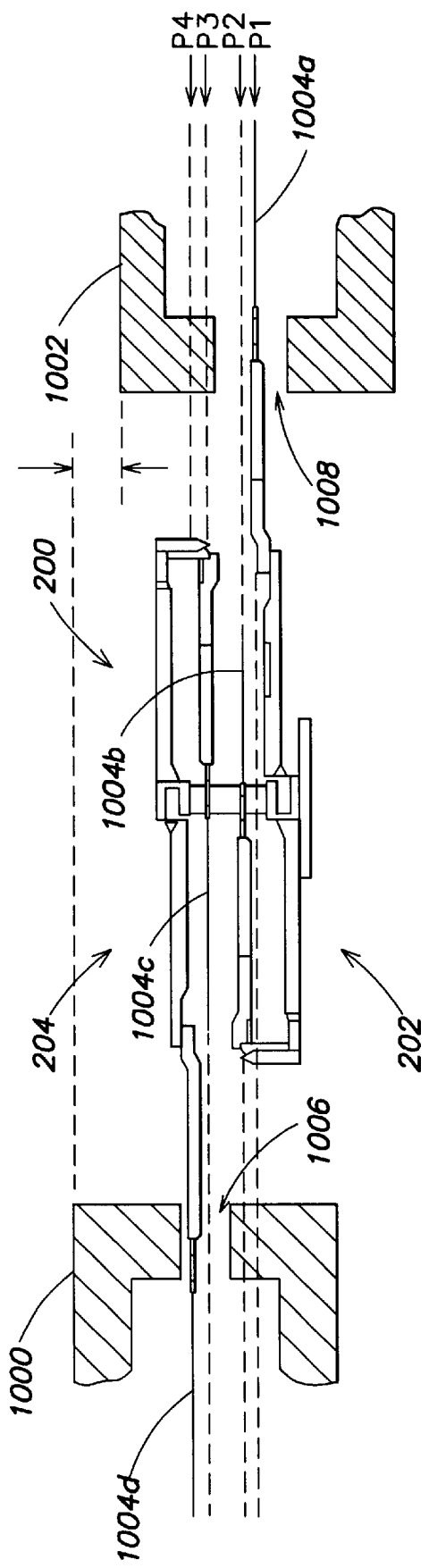
FIG. 10B is a schematic side view of the multi-set robot of FIG. 5A during wafer transfer within the first processing chamber and the second processing chamber of FIG. 10A.

FIG. 10B is a schematic side view of the multi-set robot 200 of FIG. 5A during wafer transfer within the first processing chamber 1000 and the second processing chamber 1002 of FIG. 10A. As shown in FIG. 10B, each blade (referred to by reference numerals 1004*a–d* in FIG. 10B) of the multi-set robot 200 travels in a different plane during extension and retraction (planes P1, P2, P3 and P4, respectively). As with the robot 14 of FIG. 1, within each robot set 202, 204 of the multi-set robot 200, the separation between blades may be relatively small (e.g., the distance between planes P1 and P2, or between planes P3 and P4 may be small) and accommodated by most processing chamber openings. However, because of the length required for the spool 206 (to adequately separate the robot sets 202, 204) or merely because more than two planes are employed during wafer transfer by the multi-set robot 200, a typical processing chamber such as the processing chambers 1000, 1002 may not be able to receive wafers from all four blades 1004*a–d* of the multi-set robot 200 (as shown for both the chambers 1000 and 1002 in FIG. 10B).

One solution for the above problem may be to widen the opening of the slit, chamber port or other opening (hereinafter "chamber opening") employed to transfer wafers to and from a processing chamber. However, an increased chamber opening size may lead to increased exposure of a processing chamber to contaminants (e.g., from a transfer chamber), increased pump down times, etc. A loadlock or other input/output chamber (such as the I/O chamber 16 of FIG. 1) for introducing wafers to a transfer chamber may be less susceptible to contaminants, and the use of a widened opening that accommodates all four planes of the multi-set robot 200 within a loadlock or other input/output chamber may be employed.

With regard to the processing chambers 1000, 1002 of FIG. 10B, the four planes of the multi-set robot 200 (or the multi-set robot 200') may be accommodated by effectively shifting the height of each processing chamber 1000, 1002 relative to one another. In this manner, one the processing chambers (processing chamber 1000 in FIG. 10B) may receive wafers from the second robot set 204 (which transfers wafers in planes P3 and P4) and the other processing chamber (processing chamber 1002 in FIG. 10B) may receive wafers from the first robot set 202 (which transfers wafers in planes P1 and P2).

An effective shifting of the processing chambers 1000, 1002 may achieved by (1) changing the height of one or both of the processing chambers 1000, 1002 relative to one another (e.g., by raising or lowering one or both chambers); and/or (2) by changing the height of one or both of the chamber openings of the processing chambers 1000, 1002. Changing the height of one or both of the processing chambers 1000, 1002 may require modifying the processing chambers 1000, 1002 or a transfer chamber (such as the transfer chamber 12 of FIG. 1) to which the processing chambers 1000, 1002 are coupled. However, changing the height of one or both of the chamber openings (e.g., chamber openings 1006, 1008 in FIG. 10B) for the processing chambers 1000, 1002 may be achieve merely by modifying a conventional slit valve assembly and/or chamber port assembly to provide different chamber opening heights.

Figure 10C:
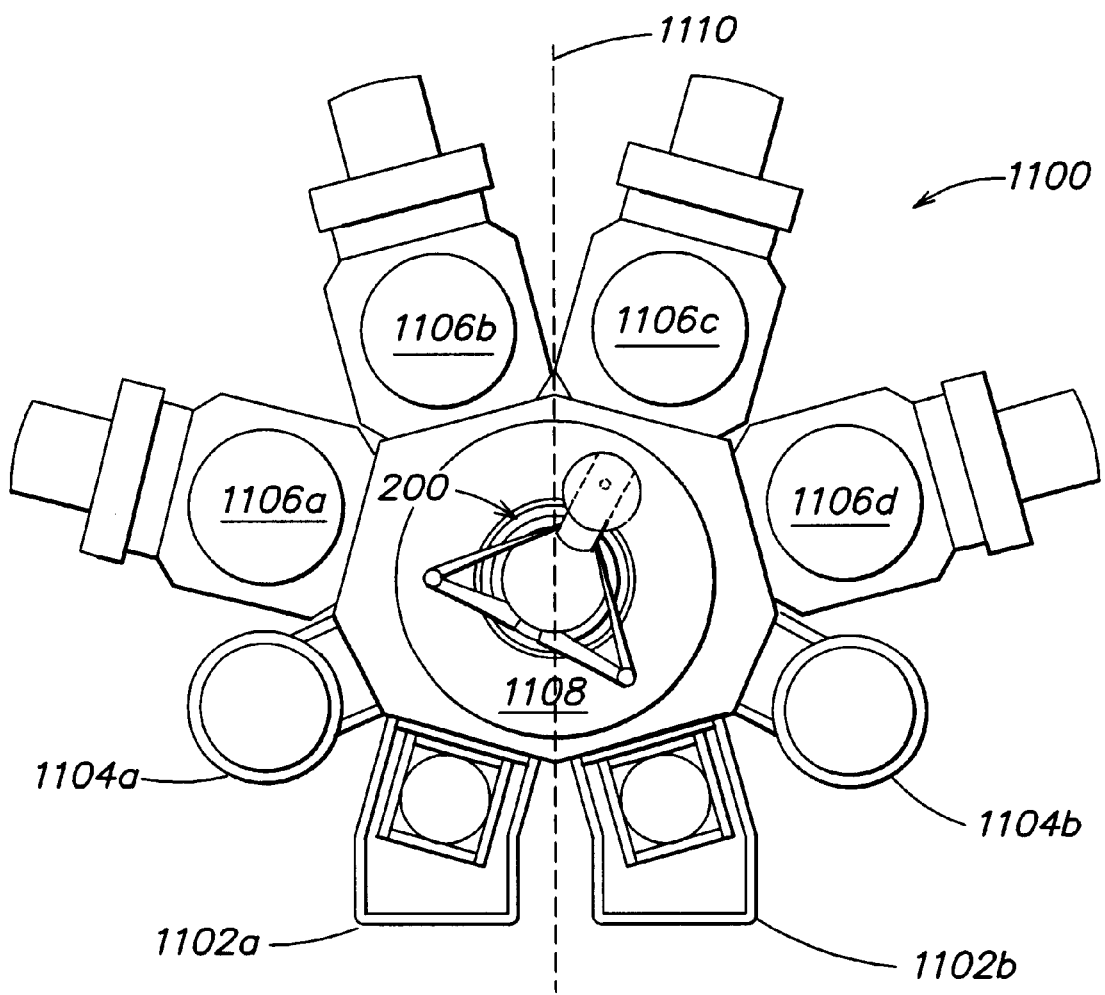
FIG. 10C is a top plan view of a semiconductor device processing tool configured in accordance with the present invention to employ the multi-set robot of FIGS. 5A and 5B.

FIG. 10C is a top plan view of a semiconductor device processing tool 1100 configured in accordance with the present invention to employ the multi-set robot 200 (although the multi-set robot 200' may be similarly employed). The processing tool 1100 includes a plurality of loadlocks 1102*a*, 1102*b*, a plurality of auxiliary processing chambers 1104*a*, 1104*b* (e.g., degas or cooldown chambers, substrate orientors, etc.), and a plurality of processing chambers 1106*a–d* all coupled to a transfer chamber 1108. In accordance with one embodiment of the invention, the processing tool 1100 is configured to perform parallel processing by performing identical processing on both sides of the processing tool 1100 as demarked by line 1110. For example, the two auxiliary processing chambers 1104*a*, 1104*b* may be configured to perform the same auxiliary process, the processing chambers 1106*a*, 1106*d* may be configured to perform a first process, and the processing chambers 1106*b*, 1106*c* may be configured to perform a second process.

In at least one embodiment, the loadlock 1102*a*, the auxiliary processing chamber 1104*a* and the processing chambers 1106*a*, 1106*b* are configured to have chamber openings (not shown) at a height that-accommodates the first robot set 202 of the multi-set robot 200; and the loadlock 1102*b*, the auxiliary processing chamber 1104*b* and the processing chambers 1106*c*, 1106*d* are configured to have chamber openings (not shown) at a height that accommodates the second robot set 204 of the multi-set robot 200. The different chamber openings heights may be accomplished, for example, by having larger than normal chamber openings (e.g., for the loadlocks 1102*a*, 1102*b* and/or for the auxiliary processing chambers 1104*a–b*) and/or by employing slit valve or chamber port assemblies that employ different chamber opening heights (e.g., for the processing chambers 1106*a–d*). In this manner, substrates may be transferred from a loadlock, auxiliary processed, processed using the first process, processed using the second process and/or transferred back to a loadlock simultaneously and/or independently on both sides of the processing tool 1100.

Figure 10D:
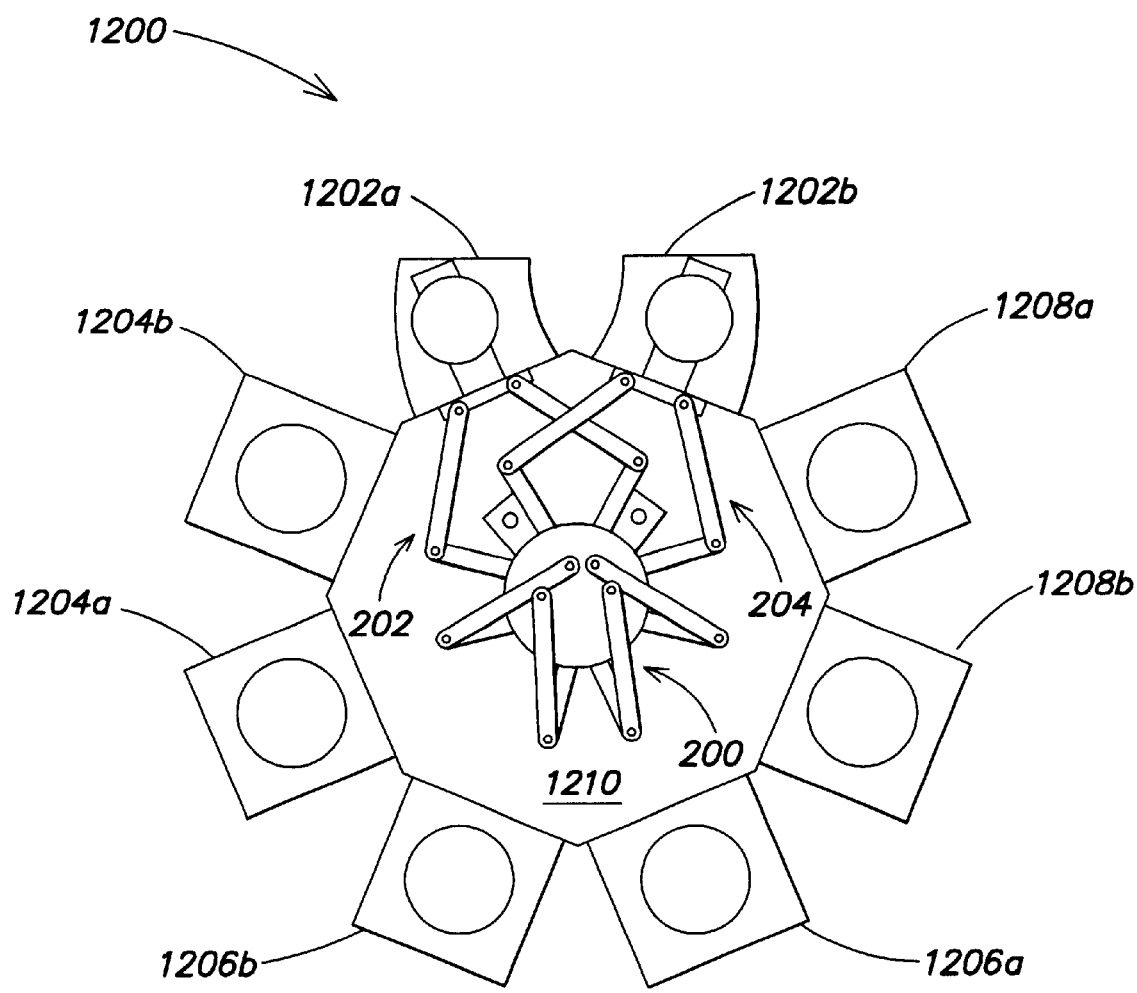
FIG. 10D is a top plan view of a semiconductor device processing tool alternatively configured in accordance with the present invention to employ the multi-set robot of FIGS. 5A and 5B.

FIG. 10D is a top plan view of a semiconductor device processing tool 1200 configured in accordance with the present invention to employ the multi-set robot 200 (although the multi-set robot 200' may be similarly employed). The processing tool 1200 includes a plurality of loadlocks 1202*a*, 1202*b*, a first set of processing chambers 1204*a–b*, a second set of processing chambers 1206*a–b* and a third set of processing chambers 1208*a–b* all coupled to a transfer chamber 1210. In accordance with one embodiment of the invention, the processing tool 1200 is configured to perform parallel processing by performing identical processing in each processing chamber set. For example, the first set of processing chambers 1204*a–b* may be configured to perform a first process, the second set of processing chambers 1206*a–b* may be configured to perform a second process and the third set of processing chambers 1208*a–b* may be configured to perform a third process.

In at least one embodiment, the loadlock 1202*a* and the processing chambers 1204*a*, 1206*a* and 1208*a* are configured to have chamber openings (not shown) at a height that accommodates the first robot set 202 of the multi-set robot 200; and the loadlock 1202*b* and the processing chambers 1204*b*, 1206*b* and 1208*b* are configured to have chamber openings (not shown) at a height that accommodates the second robot set 204 of the multi-set robot 200. The different chamber openings heights may be accomplished, for example, by having larger than normal chamber openings (e.g., for the loadlocks 1202*a*, 1202*b*) and/or by employing slit valve or chamber port assemblies that employ different chamber opening heights (e.g., for the processing chambers 1204*a*–1208*b*).

In one exemplary operation of the processing tool 1200, the first robot set 202 and the second robot set 204 of the multi-set robot 200 may operate completely independently with regard to processing substrates within the processing chambers 1204*a*–1208*b* (such as in the processing tool 1100 of FIG. 10C). However, in another exemplary operation of the processing tool 1200, the following steps may be performed:

1. employ the first and second robot sets 202, 204 to simultaneously extract a first wafer from the loadlock 1202*a* and a second wafer from the loadlock 1202*b*, respectively;
2. employ the first and second robot sets 202, 204 to simultaneously load the first wafer into the processing chamber 1204*a* and the second wafer into the processing chamber 1204*b*;
3. employ the first and second robot sets 202, 204 to independently adjust the position of the first wafer within the processing chamber 1204*a* and the position of the second wafer within the processing chamber 1204*b* (e.g., the first robot set 202 adjusting the position of the first wafer and the second robot set 204 adjusting the position of the second wafer, with both robot sets operating independently of one another);
4. simultaneously process the first and second wafers within the processing chambers 1204*a*, 1204*b*;
5. employ the first and second robot sets 202, 204 to simultaneously extract a third wafer from the loadlock 1202*a* and a fourth wafer from the loadlock 1202*b*, respectively, during processing of the first and second wafers;
6. employ the first and second robot sets 202, 204 to simultaneously extract the first and second wafers from the processing chambers 1204*a*, 1204*b* and to simultaneously load the third wafers into the processing chamber 1204*a* and the fourth wafer into the processing chamber 1204*b* without rotating either robot set;
7. employ the first and second robot sets 202, 204 to independently adjust the position of the third wafer within the processing chamber 1204*a* and the position of the fourth wafer within the processing chamber 1204*b*;
8. simultaneously process the third and fourth wafers within the processing chambers 1204*a*, 1204*b*;
9. employ the first and second robot sets 202, 204 to simultaneously load the first wafer into the processing chamber 1206*a* and the second wafer into the processing chamber 1206*b*;
10. employ the first and second robot sets 202, 204 to independently adjust the position of the first wafer within the processing chamber 1206*a* and the position of the second wafer within the processing chamber 1206*b*; and/or
11. perform similar operations to process all wafers within the processing chambers 1204*a*–1208*b*.

The foregoing description discloses only exemplary embodiments of the invention. Modifications of the above disclosed apparatus and method which fall within the scope of the invention will be readily apparent to those of ordinary skill in the art. For instance, other configurations for each robot set may be employed, as may other drive mechanisms. Further the present invention may be employed to transfer substrates other than semiconductor wafers, such as flat panel displays. Rather than employing the spool 206, the motors and shafts for the second robot set may be mounted to a top surface of transfer chamber. An "intermediate" height chamber opening may be employed that allows the top blade of the first robot set 202 and the bottom blade of the second robot set 204 to pass therethrough. A chamber employing such an intermediate height chamber opening may be used to transition from processing chambers having chamber openings at a low height (e.g., able to accommodate the lower blade of the first robot set 202) to processing chambers having chamber openings at a high height (e.g., able to accommodate the upper blade of the second robot set 204).

Each of the above described operations for the multi-set robot 200 may be similarly performed by the multi-set robot 200', and each operation may be performed and/or directed by one or more controllers (e.g., coupled to the motors 302–308). One or more steps of each operation may be implemented in computer program code and/or may comprise one or more computer program products implemented in a medium readable by a computer (e.g., a memory, a carrier wave signal or the like).

More than two robot sets may be employed within the inventive multi-set robot. Other rotatable members in place of or in addition to the rotatable rings may be used, as may different rotatable rings sizes. Other linkages than the arm assemblies described herein also may be employed.

The above description of the invention is intended in illustration and not in limitation thereof. Various changes or modifications in the embodiment set forth may occur to those skilled in the art and may be made without departing from the spirit and scope of the invention as set forth in the accompanying claims.

What is claimed is:

1. A multi-set robot adapted to transfer multiple substrates comprising:
   a first robot set comprising:
      a first motor coupled to a first rotatable member that is rotatable about an axis of rotational symmetry;
      a second motor coupled to a second rotatable member that is rotatable about the axis of rotational symmetry;
      a first plurality of blades vertically spaced from one another and each adapted to support a substrate; and
      a first linkage adapted to enable coordinated movement of the first plurality of blades on rotation of the first and second rotatable members; and
   at least a second robot set positioned above the first robot set comprising:
      a third motor coupled to a third rotatable member that is rotatable about the axis of rotational symmetry;
      a fourth motor coupled to a fourth rotatable member that is rotatable about the axis of rotational symmetry;
      a second plurality of blades vertically spaced from one another and each adapted to support a substrate; and
      a second linkage adapted to enable coordinated movement of the second plurality of blades on rotation of the third and fourth rotatable members.

2. The multi-set robot of claim 1 wherein:
   the first linkage comprises a first arm assembly and a second arm assembly each coupled to the first and second rotatable members; and
   the second linkage comprises a third arm assembly and a fourth arm assembly each coupled to the third and fourth rotatable members.

3. The multi-set robot of claim 2 further comprising:
   a first rotatable shaft that extends from the fourth motor through the first robot set to the fourth rotatable member of the second robot set;
   a second rotatable shaft which surrounds the first rotatable shaft and that extends from the third motor through the first robot set to the third rotatable member of the second robot set;
   a third rotatable shaft which surrounds the second rotatable shaft and that extends from the second motor to the second rotatable member of the first robot set; and a fourth rotatable shaft which surrounds the third rotatable shaft and that extends from the first motor to the first rotatable member of the first robot set.

4. The multi-set robot of claim 3 wherein:
the first plurality of blades comprises:
   a first blade coupled to the first and second arm assemblies by a first wrist, the first wrist configured to allow complete retraction of the first blade by the first robot set; and
   a second blade coupled to the first and second arm assemblies by a second wrist, the second wrist configured to allow complete retraction of the second blade by the first robot set; and
the second plurality of blades comprises:
   a third blade coupled to the third and fourth arm assemblies by a third wrist, the third wrist configured to allow complete retraction of the third blade by the second robot set; and
   a fourth blade coupled to the third and fourth arm assemblies by a fourth wrist, the fourth wrist configured to allow complete retraction of the fourth blade by the second robot set.

5. The multi-set robot of claim 1 wherein:
the first rotatable member and the second rotatable member are magnetically coupled to the first and second motors; and
the third rotatable member and the fourth rotatable member are magnetically coupled to the third and fourth motors.

6. The multi-set robot of claim 1 wherein:
the coordinated movement of the first plurality of blades comprises simultaneous extension of a first blade and retraction of a second blade; and
the coordinated movement of the second plurality of blades comprises simultaneous extension of a third blade and retraction of a fourth blade.

7. The multi-set robot of claim 6 wherein:
rotation of the first and second rotatable members in a first opposite direction provides extension of the first blade and retraction of the second blade; and
rotation of the third and fourth rotatable members in the first opposite direction provides extension of the third blade and retraction of the fourth blade.

8. The multi-set robot of claim 1 wherein:
rotation of the first and second rotatable members in the same direction provides rotation of the first plurality of blades; and
rotation of the third and fourth rotatable members in the same direction provides rotation of the second plurality of blades.

9. A multi-set robot adapted to transfer multiple substrates comprising:
a first robot set comprising:
   a first motor coupled to a first rotatable member that is rotatable about an axis of rotational symmetry;
   a second motor coupled to a second rotatable member that is rotatable about the axis of rotational symmetry;
   a first plurality of blades vertically spaced from one another and each adapted to support a substrate; and
   a first linkage adapted to enable coordinated movement of the first plurality of blades on rotation of the first and second rotatable members, the first linkage comprising a first arm assembly and a second arm assembly each coupled to the first and second rotatable members;
at least a second robot set positioned above the first robot set comprising:
   a third motor coupled to a third rotatable member that is rotatable about the axis of rotational symmetry;
   a fourth motor coupled to a fourth rotatable member that is rotatable about the axis of rotational symmetry;
   a second plurality of blades vertically spaced from one another and each adapted to support a substrate; and
   a second linkage adapted to enable coordinated movement of the second plurality of blades on rotation of the third and fourth rotatable members, the second linkage comprising a third arm assembly and a fourth arm assembly each coupled to the third and fourth rotatable members;
a first rotatable shaft that extends from the fourth motor through the first robot set to the fourth rotatable member of the second robot set; and
a second rotatable shaft which surrounds the first rotatable shaft and that extends from the third motor through the first robot set to the third rotatable member of the second robot set;
wherein the first plurality of blades comprises:
   a first blade coupled to the first and second arm assemblies by a first wrist, the first wrist configured to allow complete retraction of the first blade by the first robot set; and
   a second blade coupled to the first and second arm assemblies by a second wrist, the second wrist configured to allow complete retraction of the second blade by the first robot set; and
wherein the second plurality of blades comprises:
   a third blade coupled to the third and fourth arm assemblies by a third wrist, the third wrist configured to allow complete retraction of the third blade by the second robot set; and
   a fourth blade coupled to the third and fourth arm assemblies by a fourth wrist, the fourth wrist configured to allow complete retraction of the fourth blade by the second robot set.

10. A processing tool for semiconductor device fabrication having:
a transfer chamber;
a loadlock coupled to the transfer chamber and adapted to provide substrates to the transfer chamber;
a first plurality of processing chambers coupled to the transfer chamber and adapted to receive substrates from the transfer chamber at a first elevation or lower;
a second plurality of processing chambers coupled to the transfer chamber and adapted to receive substrates from the transfer chamber at an elevation above the first elevation; and
a transfer mechanism located within the transfer chamber and having:
   a first robot set adapted to rotate about an axis and to transfer substrates between the first plurality of processing chambers; and
   a second robot set positioned above the first robot set and adapted to rotate about the axis and to transfer substrates between the second plurality of processing chambers independent of the first robot set.

11. The processing tool of claim 10 wherein the first and second plurality of processing chambers are alternatingly coupled to the transfer chamber.

12. The processing tool of claim 10 wherein the first plurality of the processing chambers are coupled to a first portion of the transfer chamber and the second plurality of processing chambers are coupled to a second portion of the transfer chamber that does not overlap the first portion.

13. The processing tool of claim 10 wherein:
the first plurality of processing chambers are coupled to the transfer chamber by a first set of chamber ports having an opening adapted to receive substrates at the first elevation or lower; and
the second plurality of processing chambers are coupled to the transfer chamber by a second set of chamber ports having an opening adapted to receive substrates at an elevation above the first elevation.

14. A method of operating independently controllable robot sets in a multi-set robot comprising:
providing a multi-set robot having at least a first robot set with a first plurality of blades for supporting substrates and a second robot set positioned above the first robot set, the second robot set having a second plurality of blades for supporting substrates;
employing the first and second robot sets to simultaneously extract a first substrate from a first loadlock and a second substrate from a second loadlock;
employing the first and second robot sets to simultaneously load the first substrate into a first processing chamber having a first chamber opening height and the second substrate into a second processing chamber having a second chamber opening height; and
employing the first and second robot sets to independently adjust a position of the first substrate within the first processing chamber and a position of the second substrate within the second processing chamber.

* * * * *